United States Patent [19] [11] 4,383,230
Manzolini [45] May 10, 1983

[54] VOLTAGE TUNED ACTIVE FILTER AND CIRCUITRY SIMULATING A CAPACITANCE AND AN INDUCTANCE

[76] Inventor: David B. Manzolini, 7709 Kilbourne Rd., Rome, N.Y. 13340

[21] Appl. No.: 78,076

[22] Filed: Sep. 24, 1979

[51] Int. Cl.³ .................... H03H 11/12; H03H 11/48
[52] U.S. Cl. .................................. 333/214; 307/520
[58] Field of Search ............... 333/214, 215; 307/230, 307/295; 330/107, 109

[56] References Cited

U.S. PATENT DOCUMENTS 3,835,399 9/1974 Holmes ........................... 333/214 X
3,972,006 7/1976 Ruegg ................................ 330/107

Primary Examiner—Paul L. Gensler
Attorney, Agent, or Firm—Mueller & Smith

[57] ABSTRACT

An active filter provides precision filtering of an output signal over a wide range of signal input frequencies. Overall the active filter comprises a simulated L/C resonating loop which includes: a first operational amplifier in a loop with an operational transconductance amplifier simulating a capacitance; and a second operational amplifier in a second loop with a second operational transconductance amplifier simulating an inductance. The apparent capacitance of the first loop and the apparent inductance of the second loop can be regulated by applying a control current to each of the operational transconductance amplifiers. In a preferred embodiment the control current is derived as an antilogarithm of a linear voltage where the linear voltage corresponds to the logarithm of the filter resonant frequency. The filter output provides a constant percentage band width signal independent of the tuned frequency. The amplitude gain at resonance similarly is independent of the tuned frequency.

10 Claims, 5 Drawing Figures

VOLTAGE TUNED ACTIVE FILTER AND CIRCUITRY SIMULATING A CAPACITANCE AND AN INDUCTANCE

BACKGROUND OF THE INVENTION

1. Field of the Invention:

This invention relates to a voltage-tuned, active filter for delivering an output signal having a constant percentage band width of a tuned frequency from and input signal having a wide range of frequencies.

2. Descripiton of the Prior Art:

Heretofore electrical filters have been categorized for some purposes as passive filters and active filters. Passive filters in general are those filters which do not require external power. R/C filters, L/C filters of the passive type are well known. Active filters are those which employ external power and which normally do not alter the signal which is experiencing filtration.

Prior art filters, active and passive, have relied upon fixed electrical circuit components such as resistors, capacitors and inductors. Where the circuit components are fixed, the tuned frequency of the resulting filter is also fixed. In order to provide for variable tuning of the filter center frequency, certain of the filter elements have been made variable. Thus by adjusting the resistance of certain resistors, the capacitance of certain capacitors and the inductance of certain inductors, some variation of filter response frequency has been achieved. The range of such variation has been limited. Accordingly, multiple separate complete filter circuits have been used to provide a filtering response over small segments of a relatively wide spectrum.

There exists a need for a voltage-tunable filter having a constant percentage band width. Such filter should be accurately and precisely tunable over a wide spectrum of input signal frequencies.

SUMMARY OF THE INVENTION

According to the present invention, an active electrical signal filter is provided which includes:

First: a simulated capacitance which comprises a first operational amplifier connected in a first loop with a first operational transconductance amplifier; and Second: a simulated inductance which comprises a second operational amplifier connected in a second loop with a second operational transconductance amplifier; and a closed loop for connecting the first loop to the second loop to constitute a resonating, simulated L/C band-pass tuned circuit; and current generating means for regulating the apparent capacitance of the simulated capacitance and for regulating the apparent inductance of the simulated inductance; and means for introducing into the closed loop an input signal having a wide spectrum of vibration frequency components and means for withdrawing from the closed loop an output signal at a signal frequency. The active filter is particularly useful in electromechanical vibration analysis wherein electrical vibration signals, containing repetitive electrical signals at a variety of frequencies, can be filtered to permit inspection of those frequency components within a narrow band of frequencies under observation.

DESCRIPTION OF THE PREFERRED EMBODIMENTS

Figure 1:
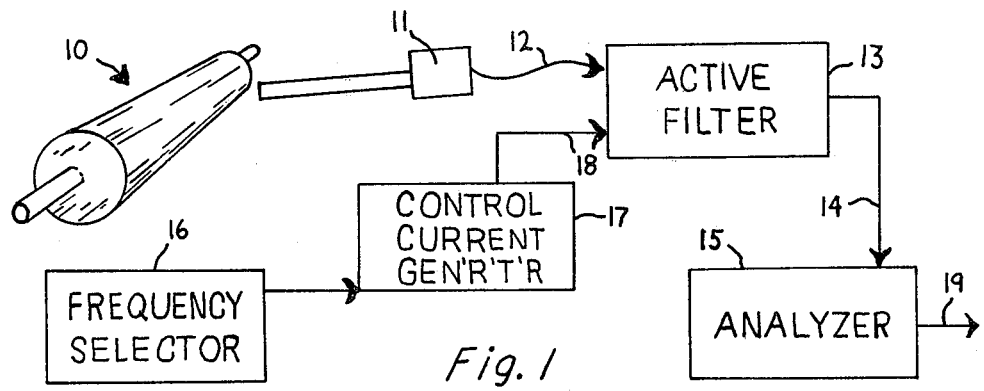
FIG. 1 is a schematic illustration of the elements of a typical mechanical vibration analysis installation with which the present invention is concerned in a preferred embodiment.

Referring to FIG. 1 there is illustrated a rotor 10 which, upon rotation, exhibits mechanical vibrations. An electromechanical transducer 11 converts the mechanical vibrations of the rotor 10 into an electrical signal which is delivered through a conductor 12 to an active filter 13 in accordance with the present invention. The electrical signal in the conductor 12 contains components at many frequencies, for example, the fundamental frequency of rotation of the rotor 10 and many other multiples and submultiples of that frequency along with additional signals generated by noise in the system. It is important to analyze only those components of the electrical signal which occur at selected frequencies. The function of the active filter 13 is to deliver through a conductor 14 to an analyzer 15 the selected frequency components of the input signal. According to the present invention, the filtering function of the active filter 13 is regulated by a frequency selector 16 which controls a current generator 17 to produce a control current through a conductor 18 to the active filter 13. The control current applied to the conductor 18 determines the resonating frequency of the active filter 13.

The analyzer 15 thereupon delivers an output signal through a conductor 19 which can be visibly displayed, recorded, applied to other control devices, etc.

For normal rotors 10, rotational frequencies of 10 to 10,000 cycles per second are of interest. The present active filter will produce precise constant percentage band width filtration and constant amplification over those frequencies.

Figure 2:
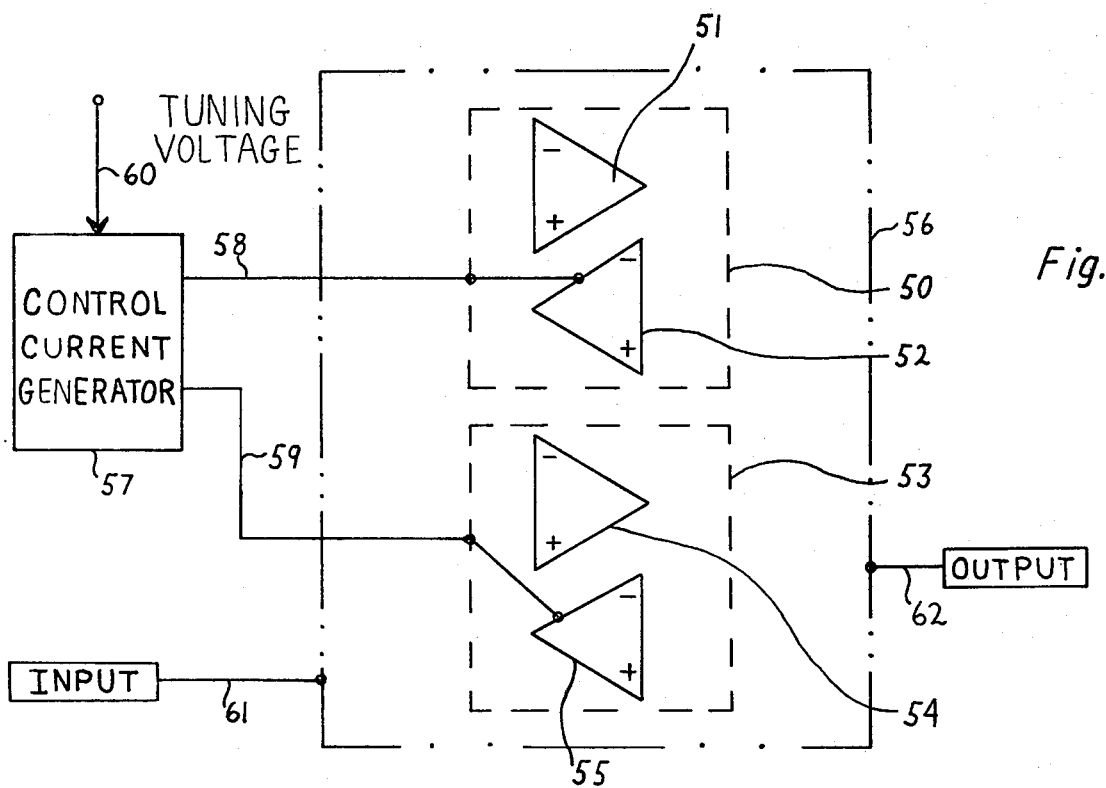
FIG. 2 is a schematic circuit diagram representing the essential features of the present active filter.

Referring to FIG. 2, the present active filter can be broadly described as including a simulated capacitance 50 which includes an operational amplifier 51 connected in series with an operational transconductance amplifier 52. The active filter further includes a simulated inductance 53 comprising an operational amplifier 54 and an operational transconductance amplifier 55 connected in series. The simulated capacitance 50 and the simulated inductance 53 are connected in a closed loop 56. A control current generator 57 supplies a control current through conductors 58, 59 to a control current terminal of the operational transconductance amplifiers 52, 55, respectively.

A tuning voltage is applied to the control current generator through a conductor 60. An input signal having a wide spectrum of frequencies is applied to the closed loop 56 through a conductor 61. An output signal is withdrawn from the closed loop 56 through an output conductor 62.

Figure 3:
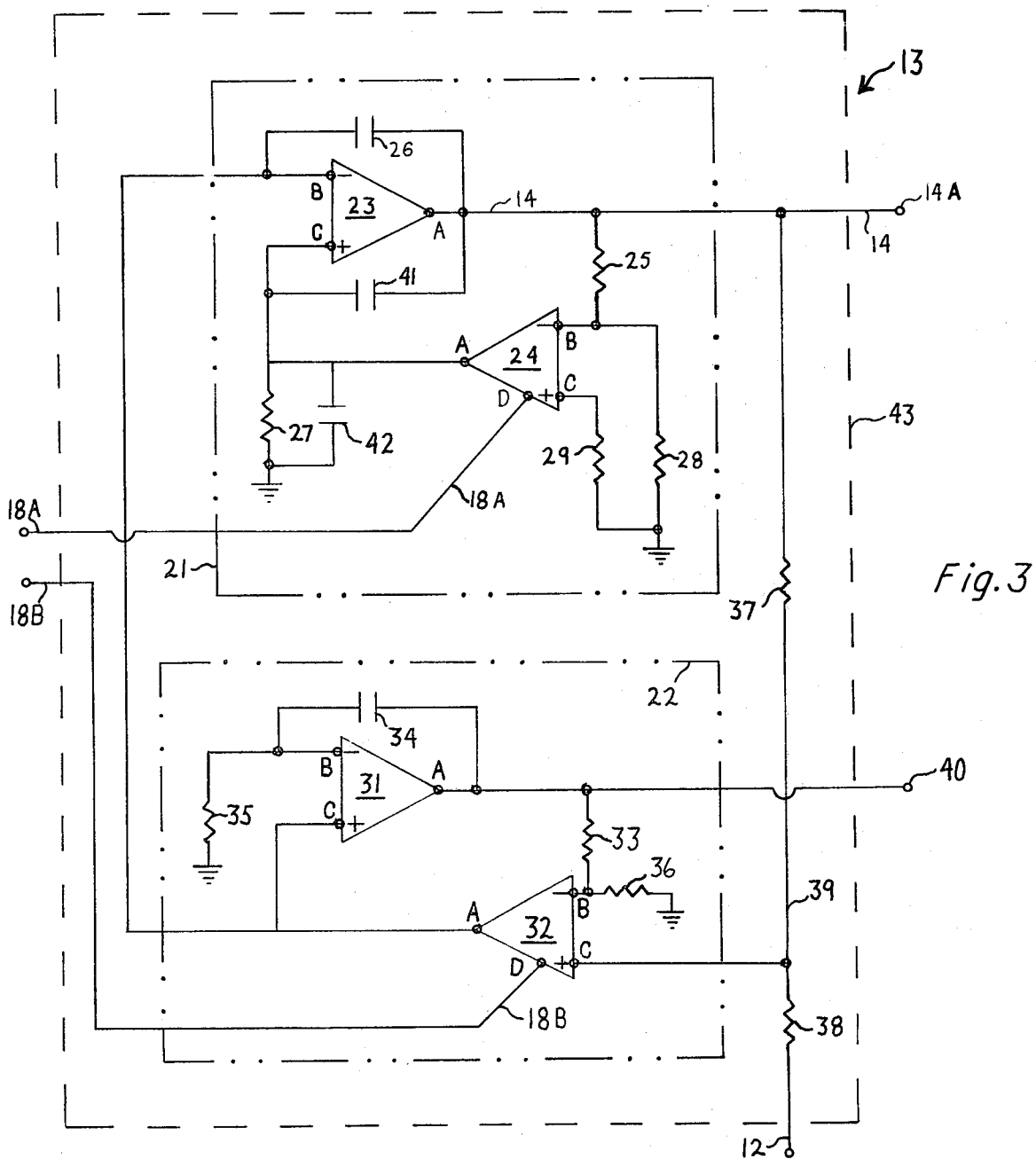
FIG. 3 is a further schematic illustration of the essential elements of an active filter which exploits the present invention.

The active filter, shown in FIG. 3, includes the essential circuitry for achieving the described filtration. The wide frequency spectrum signal is applied through a conductor 12 and the output signal delivered through a conductor 14. The control currents are applied to the active filter through separate conductors 18a, 18b.

Within the active filter, a first closed loop 21 simulates a capacitance and a second closed loop 22 simulates an inductance. Within the closed loop 21 a first operational amplifier 23 (OP. AMP.) and a first operational transconductance amplifier 24 (OTA) are connected such that the output terminal 24a of the OTA 24 is connected to the non-inverting input terminal 23c of the OP. AMP. 23; the output 23a of the OP. AMP. 23 is connected through a resistance 25 to the inverting input terminal 24b of the OTA 24. The inverting input terminal 23b of the OP. AMP. 23 is connected through a capacitor 26 to the output 23a of the OP. AMP. 23. The output 24a of the OTA 24 is connected to ground through a parallel resistor 27 and capacitor 42. The two terminals 24b, 24c of the OTA 24 are connected to ground through resistors 28, 29, respectively. A control current is supplied to a control current terminal 24d of the OTA 24 through a conductor 18a. A capacitor 41 connects the output terminal 23a of the OP. AMP. 23 to its non-inverting input terminal 23c. In operation, the current applied to the control terminal 24d of the OTA 24 establishes the value of the simulated capacitance of the closed loop 21.

Within the closed loop 22, an operational amplifer 31 (OP. AMP.) is connected to an operational transconductance amplifier 32 (OTA) such that the output 32a of the OTA 32 is connected to the non-inverting input terminal 31c of the OP. AMP. 31. The output terminal 31a of the OP. AMP. 31 is connected through a resistor 33 to the inverting input terminal 32b of the OTA 32. The inverting input terminal 31b of the OP. AMP. 31 is connected to the output terminal 31a through a capacitor 34. The inverting input terminal 31b of the OP. AMP. 31 is connected to ground through a resistor 35. The inverting input terminal 32b of the OTA 32 is connected to ground through a resistor 36. A control current, applied to the control current terminal 32d of the OTA 32 through the conductor 18b, determines the value of the simulated inductance of the closed loop 22.

The closed loop 21 is connected with the closed loop 22 into a closed loop 43 by connecting the output terminal 32a of the OTA 32 with the inverting input terminal 23b of the OP. AMP. 23 and further by connecting the output terminal 23a of the OP. AMP. 23 through a resistance 37 to the non-inverting terminal 32c of the OTA 32.

When thus connected, as shown in FIG. 3, the closed loop 43 exhibits a resonating band-pass characteristic with resonant (peak amplitude) frequency which is dependent upon the current applied through conductors 18a, 18b to the control terminals 24d, 32d of the OTA 24 and OTA 32, respectively.

In a preferred embodiment, the wide spectrum vibration signal is applied to the closed loop 43 through the conductor 12 and a resistor 38 to a summing terminal 39 which coincides with the non-inverting input terminal 32c of the OTA 32. Depending upon the instantaneous current appearing in the current conductors 18a, 18b, the components of the input signal within the selected band of the filter will be delivered at the conductor 14.

A further useful feature with the present active filter circuitry is that an output signal will be delivered at a terminal 40 displaced in phase by 90° from the output signal appearing at the conductor 14 and terminal 14a. Some applications can usefully employ the in-phase signal at the terminal 14a and the quadrature phase signal appearing at the terminal 40.

It will be noted that a capacitor 41 is connected between the output terminal 23a of the OP. AMP. 23 and the non-inverting input terminal 23c. The value of the capacitor 41 establishes the maximum Q of the present filter.

It will further be observed in FIG. 3 that a capacitor 42 is applied between the output terminal 24a of the OTA 24 and ground in parallel with the resistor 27. The capacitor 42 and the resistor 27 establish an RC time constant for the simulated capacitance 21. In a similar fashion, the capacitor 34 and the resistor 35 establish the RC time constant of the simulated inductance 22.

The control currents applied through conductors 18a, 18b determine the tuned frequency of the active filter 13 and hence the center frequency of the output signal at the terminals 14a, 40. The operator desires to control the resonating frequency and for this purpose a frequency selector 16 (FIG. 1) is provided. The frequency selector 16 may be a manually adjustable knob combined with a frequency meter whereby the operator can adjust the control knob and thereby establish the control currents at 18a, 18b until the frequency meter indicates the desired tuned frequency for the active filter 13.

Figure 4:
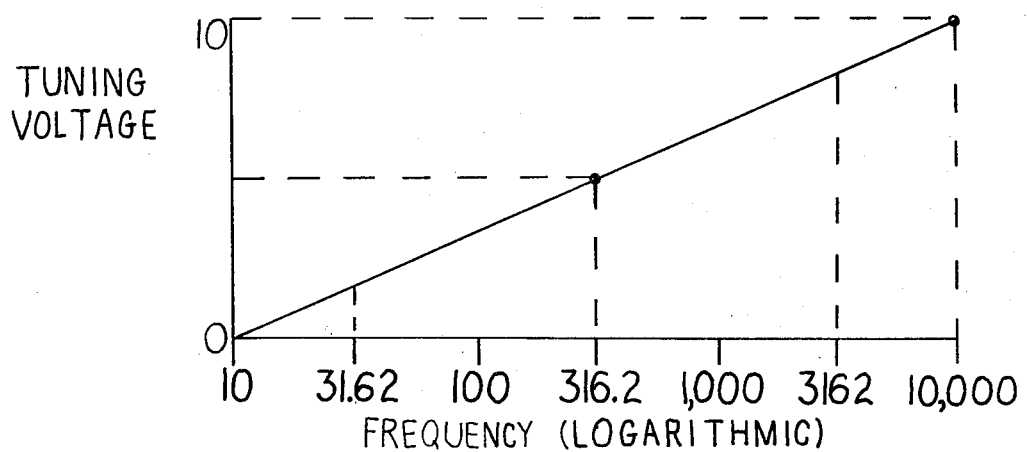
FIG. 4 is a graphical illustration of the quantitative relationship of a tuning voltage with the tuned frequency of the active filter.
Figure 5:
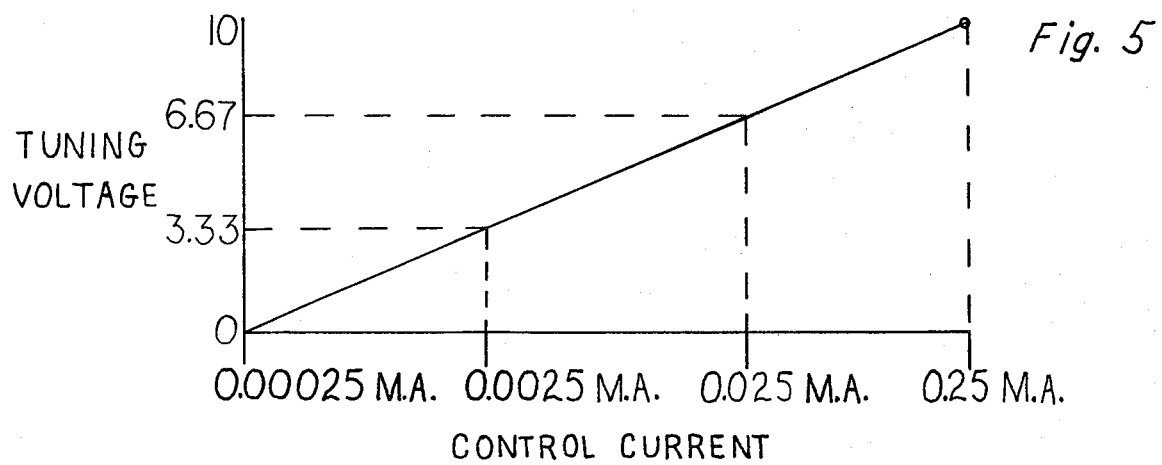
FIG. 5 is a graphical illustration of the quantitative relationship of the tuning voltage with a control current in a preferred embodiment.

Referring to FIG. 4, it will be observed that the frequency can be related logarithmically to a linear control voltage, identified as a tuning voltage. Thus as the tuned frequency ranges through three decades from 10 cps—100 cps—1000 cps—10,000 cps, the tuning voltage can be varied linearly from 0 to 10 volts as shown in FIG. 4. That same tuning voltage can be applied, as shown in FIG. 5, to an antilog generator which generates an output current having an antilog relation to the linear tuning voltage. Thus, in an actual embodiment, as the tuning voltage varies from 0 to 10 volts. the control current ranges from 0.00025 milliamperes to 0.25 milliamperes in three decades. Where the tuned voltage is 3.33 volts, the control current is 0.0025 milliamperes. Where the control voltage is 6.67 volts, the control current is 0.025 milliamperes.

The output control current as developed in FIG. 5 is applied separately to the two conductors 18a, 18b. The resulting simulated LC circuit resonates at a frequency which can be determined from FIG. 4 in accordance with the tuning voltage.

Referring to FIG. 1, the control current generator 17 may be regulated by a frequency selector related to the instantaneous velocity of the rotor 10, e.g., by means of a tachometer associated with the rotor 10 or a strobe lamp flashing on the rotor 10 combined with the filter 13 as described in U.S. Pat. No. 3,228,235.

When the active filter 13 is employed to generate a spectrum analysis of the vibrations of rotor 10, the frequency selector 16 may be a circuit which generates an increasing voltage from zero to full scale voltage (e.g., 0 to 10 volts) corresponding to the full frequency range (e.g., 10 to 10,000 cps) of the filter 13.

Referring again to FIG. 3, the input signal (voltage) is illustrated at the conductor 12 applied through a resistor 38 to a summing terminal 39. Alternatively, the input signal (voltage) could be applied to the non-inverting input terminal 24c of the OTA 24—in which event the inphase filtered signal will appear at the terminal 40 and the quadrature phase filtered signal will appear at the terminal 14a.

Further the input signal may be applied as a current at
(a) the output terminal 24a of OTA 24; or
(b) the output terminal 32a of OTA 32; or
(c) the non-inverting input terminal 31b of OP. AMP. 31.

Output signals will appear at the terminals 14a, 40.

As a general observation, the present active filter provides a signal amplification within the selected frequency band which is independent of the tuned frequency of the filter. Similarly the constant percentage band width of the output signal is independent of the tuned frequency of the filter. The phrase constant percentage band width indicates that, for example, if the band width is 4 percent, then the filtered signal at 100 (nominally) cycles per second will be from 98 to 102 cycles per second. However, at a tuned frequency of 5000 (nominally) cps, the signal band width will be from 4900 to 5100 cycles per second.

I claim:

1. A voltage-tunable active filter comprising a resonating closed loop circuit including
   a simulated capacitance comprising a first operational amplifier connected in a first closed loop with a first operational transconductance amplifier and means for applying a control current to the said first operational transconductance amplifier for establishing the simulated capacitance of the said first closed loop;
   a simulated inductance comprising a second operational amplifier connected in a second closed loop with a second operational transconductance amplifier and means for applying a control current to the said second operational transconductance amplifier for the purpose of establishing the simulated inductance of the said second closed loop;
   conductor means joining the output terminal of the said second operational transconductance amplifier to the inverting input terminal of the said first operational amplifier; the inverting input terminals of both operational transconductance amplifiers being connected through a resistor to ground; the said first closed loop, said second closed loop, said conductor means and ground constituting the said resonating closed loop;
   means for introducing a multi-frequency input signal into the said resonating closed loop; means for withdrawing from the said resonating closed loop an output signal having amplified signal components within a constant percentage band width about the resonating frequency of the said resonating closed loop.

2. The active filter of claim 1 wherein the said means for introducing the multifrequency input signal comprises conductor means including a resistor means connected to the non-inverting input terminal of the said second transconductance amplifier; and
   wherein the output terminal of said first operational amplifier is connected through a resistor to the non-inverting input terminal of said second operational transconductance amplifier; and
   wherein the said means for withdrawing an output signal includes a conductor connected to the output terminal of the said first operational amplifier or a conductor connected to the output terminal of the said second operational amplifier.

3. The active filter of claim 2 wherein one output signal is withdrawn from the said resonating closed loop at the output terminal of the said first operational amplifier in phase with the said input signal and a second output signal is withdrawn from the output terminal of the said second operational amplifier in quadrature phase relation to the said input signal.

4. The active filter of claim 1 wherein a capacitor is provided between the output terminal of said first operational amplifier and its non-inverting input terminal to establish the maximum Q of the filter.

5. The active filter of claim 1 wherein the output terminal of the said first operational transconductance amplifier is connected
   (a) to the non-inverting input terminal of the said first operational amplifier; and
   (b) to ground through a parallel resistor and capacitor whereby the said parallel resistor and the said capacitor establish the time constant of the said first loop.

6. The active filter of claim 1 wherein the inverting input terminal of the said second operational amplifier is connected
   (a) through a capacitor (34) to the output terminal of the said second operational amplifier; and
   (b) through a resistor (35) to ground; whereby the said capacitor (34) and said resistor (35) establish the time constant of the inductance of the said second loop.

7. The active filter of claim 1 wherein the said control terminals of the said first operational transconductance amplifier and the said second operational transconductance amplifier receive a control current of the same quantity which establishes the resonating frequency of the said resonating closed loop.

8. The active filter of claim 7 wherein the said control current is generated in an antilog generator including
   an input means for receiving an adjustable input tuning voltage;
   output means which develop a current varying according to the antilog of the said input tuning voltage, whereby the resonating frequency of the said resonating closed loop increases logarithmically according to the said input tuning voltage.

9. As a subcombination in an electrical circuit, a simulated capacitance including
   an operational amplifier and an operational transconductance amplifier;
   the output terminal of said operational amplifier being connected through a resistance to the inverting input terminal of the said operational transconductance amplifier; the inverting input terminal of the said operational amplifier being connected through a capacitor to the output terminal of the said operational amplifier; the non-inverting input terminal of said operational amplifier being connected through a capacitor to the output terminal of the said operational amplifier; the output of said operational transconductance amplifier being connected (a) to the non-inverting input terminal of said operational amplifier; and (b) through a parallel resistor and capacitor to ground; the inverting input terminal and the non-inverting input terminal of the said operational transconductance amplifier each being connected to ground through a separate resistor; conductor means for applying a control current to a control terminal of the said operational transconductance amplifier; terminal means connected to the inverting input terminal of the said operational amplifier whereby the circuitry between said terminal means with respect to ground simulates a capacitance having a capacitance value which is dependent upon the reciprocal of the applied control current; and an output terminal means connected to the output terminal of said operational amplifier whereby the voltage on said output terminal means is proportional to the voltage across said simulated capacitance.

10. As a subcombination in an electrical circuit, a simulated inductance including:
an operational amplifier and an operational transconductance amplifier;
the output terminal of said operational amplifier being connected through a resistance to the inverting input terminal of the said operational transconductance amplifier; the said inverting input terminal of the said operational transconductance amplifier being connected through a resistor to ground; the output of said operational transconductance amplifier being connected to the non-inverting input terminal of the said operational amplifier; a capacitor connecting the inverting input terminal of the said operational amplifier to its output terminal; said inverting input terminal of said operational amplifier being connected through a resistance to ground;
means for applying a control current to a control current terminal of the said operational transconductance amplifier;
terminal means connected to the non-inverting input terminal of said operational amplifier whereby the circuitry between said terminal means with respect to ground simulates an inductance having a value which is dependent upon the reciprocal of the applied said control current; and output terminal means connected to the output terminal of said operational amplifier whereby the voltage on said output terminal means is proportional to the current through said simulated inductance;
the simulated inductance of the said circuit between the said output terminals varying logarithmically in accordance with the applied current at the said control current terminal of the said operational transconductance amplifier.

* * * * *